United States Patent
Liao et al.

(10) Patent No.: US 7,137,841 B1
(45) Date of Patent: Nov. 21, 2006

(54) LIF SOCKET CONNECTOR

(75) Inventors: Fang-Jwu Liao, Tu-Cheng (TW); Nick Lin, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/446,686

(22) Filed: Jun. 5, 2006

(30) Foreign Application Priority Data

Jun. 3, 2005 (TW) .............................. 94118414 A

(51) Int. Cl.
*H01R 4/50* (2006.01)

(52) U.S. Cl. ...................................... 439/342; 439/857

(58) Field of Classification Search ................ 439/342, 439/857
See application file for complete search history.

(56) References Cited

U.S. PATENT DOCUMENTS

| | | | | |
|---|---|---|---|---|
| 4,422,703 A | * | 12/1983 | Christensen et al. | 439/266 |
| 6,267,615 B1 | * | 7/2001 | Lin | 439/342 |
| 6,454,617 B1 | * | 9/2002 | Chiu | 439/857 |
| 2005/0142920 A1 | * | 6/2005 | Hashimoto | 439/342 |

* cited by examiner

*Primary Examiner*—Tho D. Ta
(74) *Attorney, Agent, or Firm*—Wei Te Chung

(57) ABSTRACT

A LIF socket (10) for electrically connecting an IC package and a PCB includes an insulative housing (20) having a supporting surface (202) and a mounting surface (204) opposite to the supporting surface. A number of passages (206) extend from the mounting surface. Each passage has a leading section (208). A number of contacts (30) are disposed in corresponding passages, respectively. Each contact has a planar body (302), a pair of arms (304) extending from two lateral sides of the planar body towards the supporting surface, and a soldering pad (306) angled with respect to the planar body. The arm is formed with a curved contacting (3080) section at a distal end thereof.

4 Claims, 8 Drawing Sheets

(The Related Art)

LIF SOCKET CONNECTOR

BACKGROUND OF THE INVENTION

1. Field of the Invention

The present invention relates to a LIF (low insertion force) socket for electrically connecting an IC (integrated circuit) package and a PCB (printed circuit board).

2. Description of the Prior Art

LIF sockets are widely used in computers, and are generally used for electrically connecting two separate electrical components. Accordingly, data and signal's transmission between the two components is achieved.

A typical LIF socket generally includes an insulative housing and a plurality of contacts disposed in corresponding passages of the housing, respectively. Each contact defines a pair of touching pads for contacting with a corresponding pin of an IC package, and a soldering pad opposite to the touching pad. When the IC package is mounted on the LIF socket and is pressed, each pin contacts the corresponding pair of touching pads of the contact. Accordingly, the IC package is electrically connected to the PCB.

Chinese Utility Model Pat. No. 98252212.6 discloses a conventional LIF socket as shown in FIG. 8. The LIF socket includes an insulative housing and a plurality of contacts 3 disposed in corresponding passages of the housing, respectively. Each contact 3 comprises a base 31, a pair of arms 32 extending from two sides of the base 31, and a soldering pad 34 extending from a bottom end of the base 31. Each arm includes an extending arm 321 extending from the base 31 and a spring arm 322 extending from a top end of the extending arm 321 and bending inwardly. When the pins of the IC package are inserted into corresponding pairs of spring arms, the spring arms are forced to deflect elastically, which enables the pins to contact with the contacting sections for assembling the IC package with the LIF socket.

However, one problem can be encountered when assembling the IC package onto the LIF socket. The problem is that only the spring arms of the contact are elastically deformed and the flexibility of the whole contact is not good enough.

Another problem is that each pin of the IC package can not be easily inserted into or withdrawn from the corresponding pair of spring arms because the contact portions of the contact are curve-configured, which raises high resistance.

In addition, if the pins of the IC package offset from a normal position during assembling, the spring arms of the contact will be broken easily because of the interferential force between the pins and the spring arms.

SUMMARY OF THE INVENTION

Accordingly, a major object of a preferred embodiment of the present invention is to provide a LIF socket which is convenient for pins of an IC package to be inserted into or taken out of.

To fulfill the above-mentioned object, a LIF socket in accordance with a preferred embodiment of the present invention comprises a housing having a supporting surface and a mounting surface opposite to the supporting surface. A number of passages extends from the mounting surface. Each passage has a leading section. A plurality of contacts are disposed in the corresponding passages, respectively. Each contact has a planar body, a pair of arms extending from two lateral sides of the planar body towards the supporting surface, and a soldering pad angled with respect to the planar body. The arm is formed with a curved contacting section at a distal end thereof. The curved contacting section is provided with a smooth curved surface.

Accordingly, several objects and advantages of the present invention are that the elasticity of the spring arms is improved by disposing curved contacting sections on the arms of the contacts to increase an extending length of the arms; that the pins of the IC package can insert into or withdrawn from the spring arms easily by disposing smooth curved surface on the contacting section of the contact; and that the pins of the IC package can insert into the corresponding arms rapidly during assembling by presence of the leading slot and the smooth curved surface on the contact portion of the contact.

Other objects, advantages and novel features of the present invention will become more apparent from the following detailed description when taken in conjunction with the accompanying drawings.

DESCRIPTION OF PREFERRED EMBODIMENT OF THE INVENTION

Reference will now be made to the drawings to describe the present invention in detail.

Figure 1:
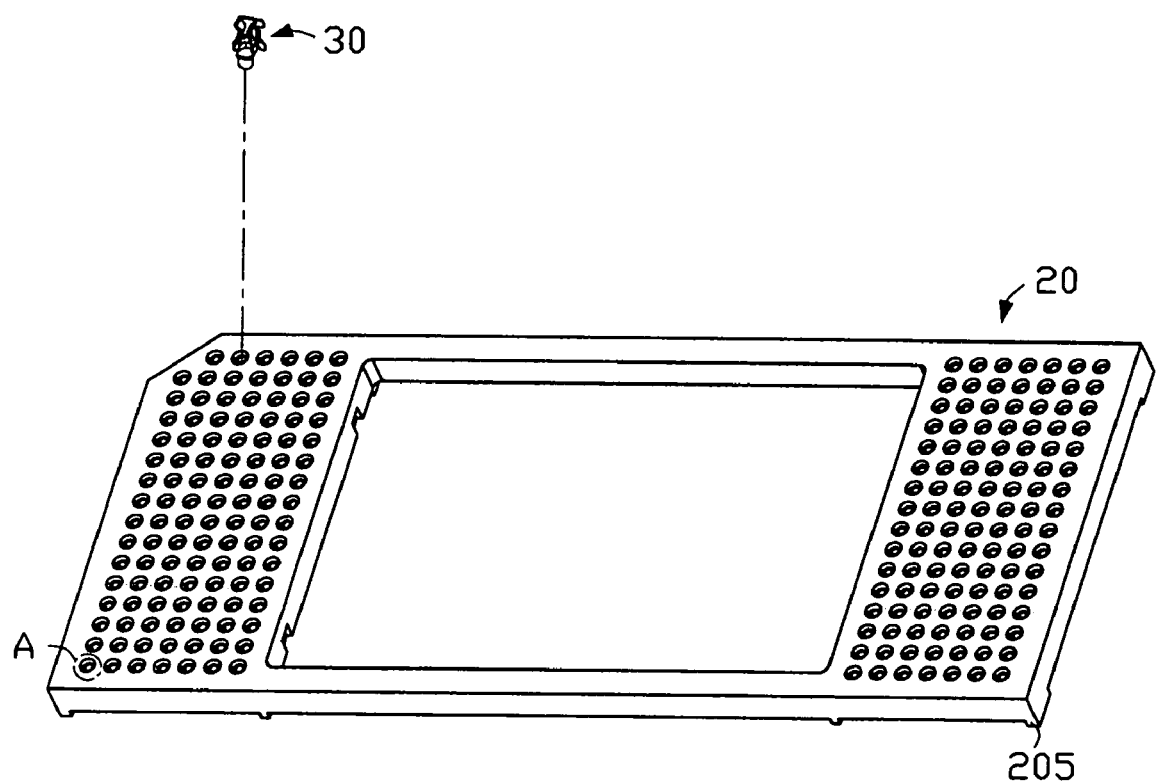
FIG. 1 is an assembled view of a LIF socket in accordance with a preferred embodiment of the present invention, together with a contact taken out of a housing of the socket.

FIG. 1 is an assembled view of a LIF socket 10 for electrically connecting an IC package (not shown) and a PCB (not shown) in accordance with a preferred embodiment of the present invention. The socket 10 comprises a housing 20 and a plurality of contacts 30 received therein.

Figure 5:
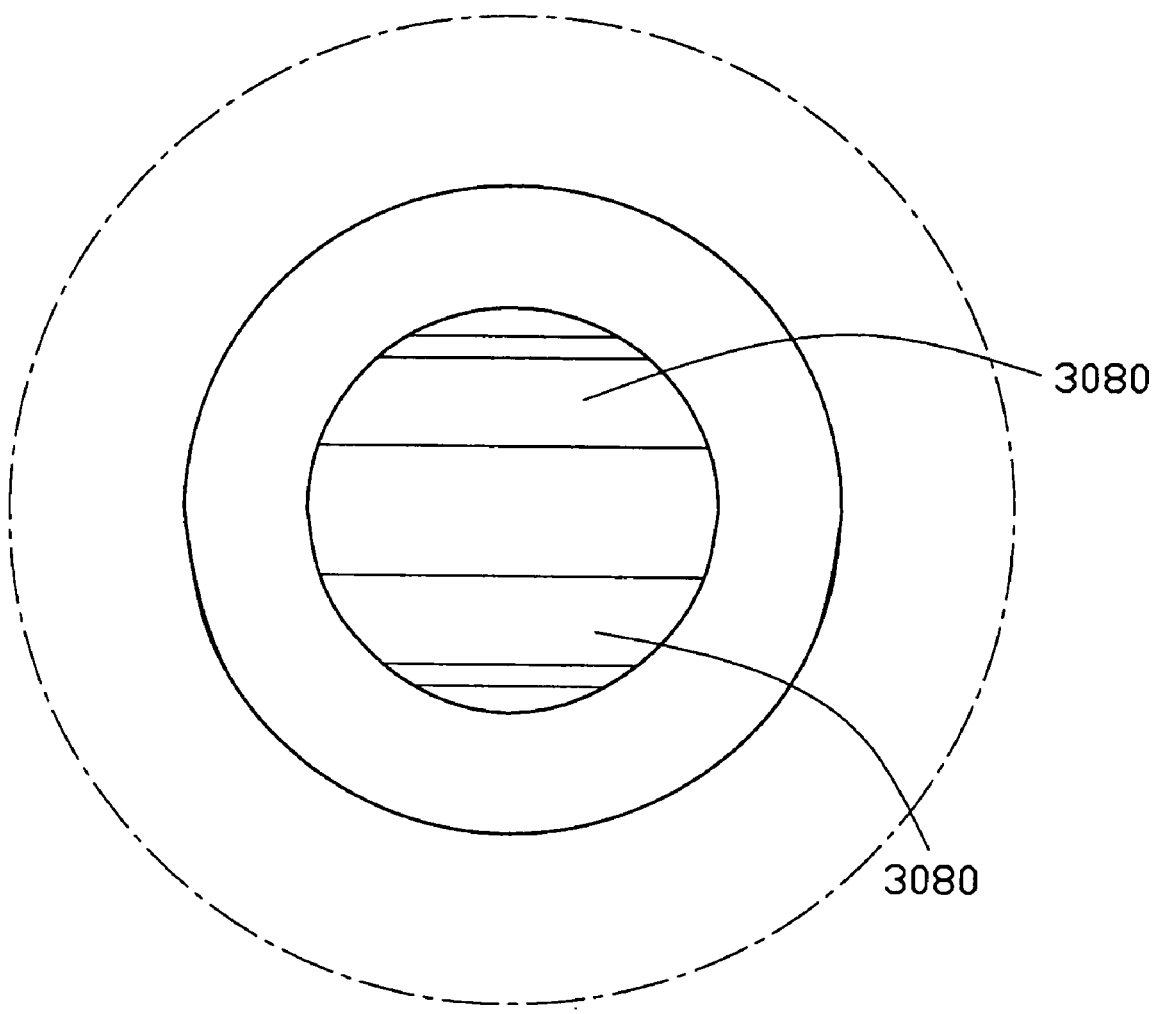
FIG. 5 is an enlarged top view of part A of FIG. 1.
Figure 7:
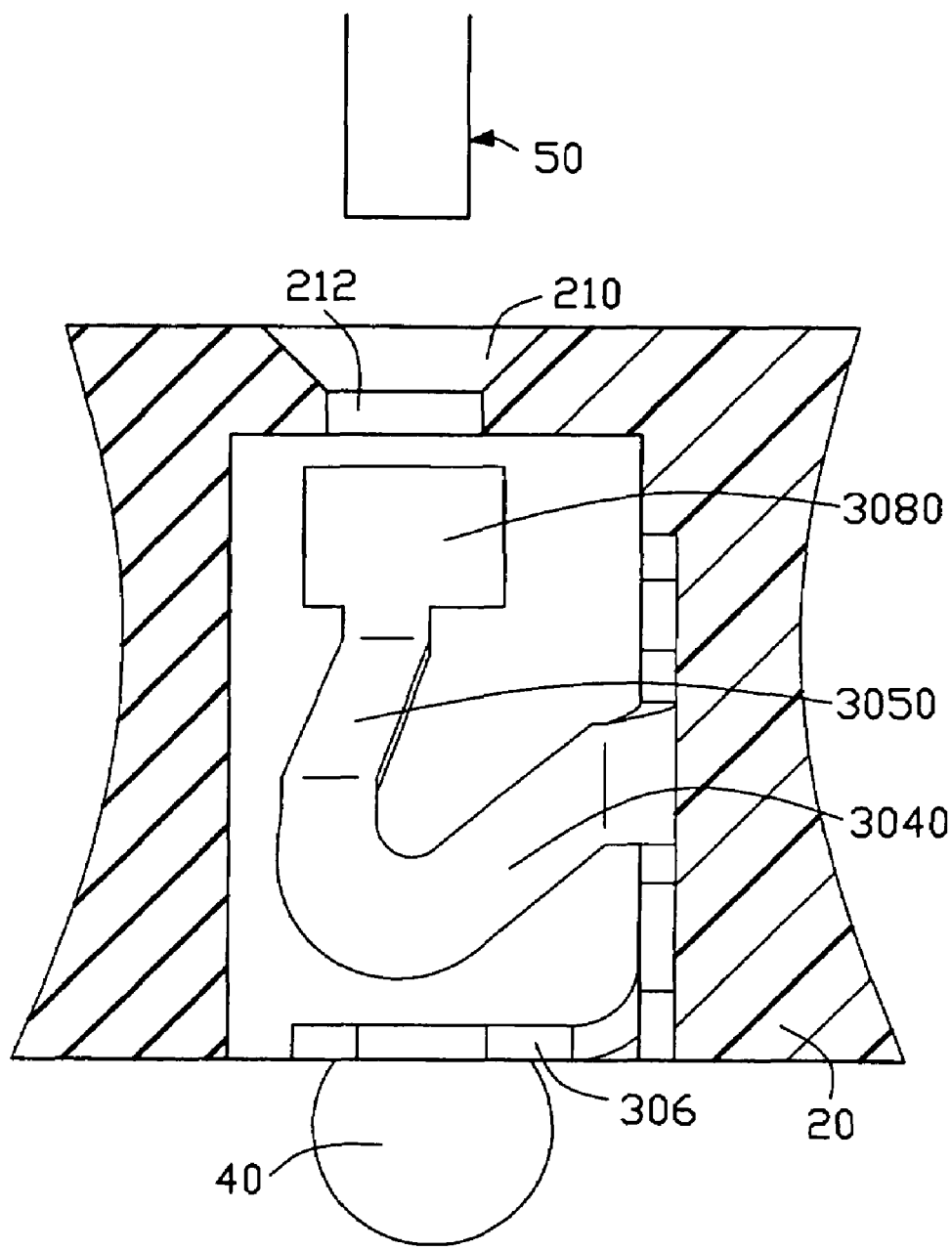
FIG. 7, which is similar to FIG. 6, is a cross sectional view of FIG. 1 from another aspect.
Figure 8:
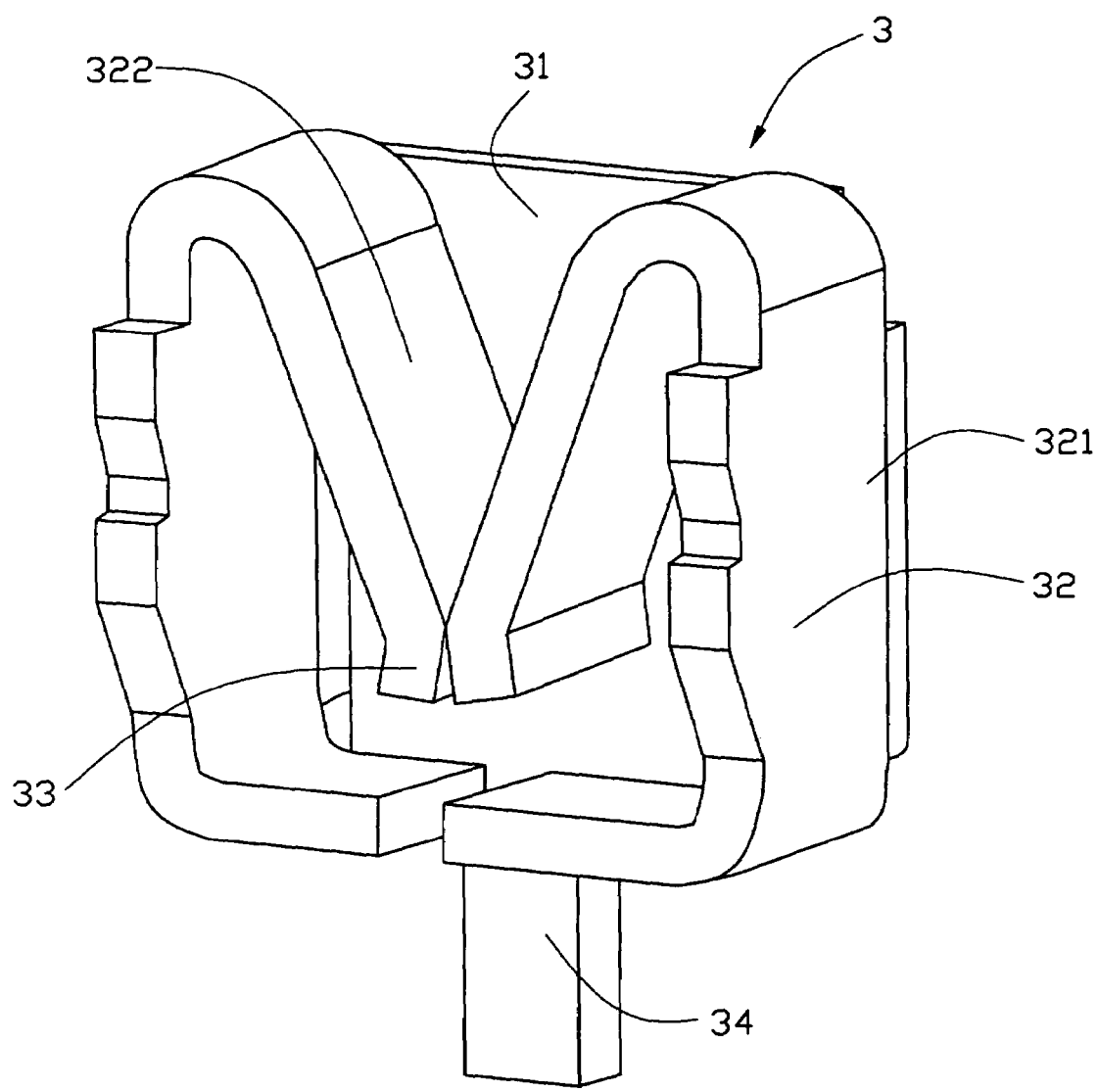
FIG. 8 is an isometric view of a conventional contact for a LIF socket.

As indicated in FIGS. 1, 5 and 7, the housing 20 is made of insulating material and is rectangular. The housing 20 has a supporting surface 202 and a mounting surface 204 opposite to the supporting surface 202. A number of standoffs 205 is provided at four corners of the mounting surface 204 as no known for the purpose of subsequent soldering process.

A number of passages 206 extends from the mounting surface 204. Each passage 206 comprises a leading section 210, a connecting section 212, and a base section 208. The connecting section 212 is a circular aperture and a diameter thereof is greater than that of a pin 50 of the IC package but smaller than a distance D between two contacting sections 3080 of the contact.

Figure 2:
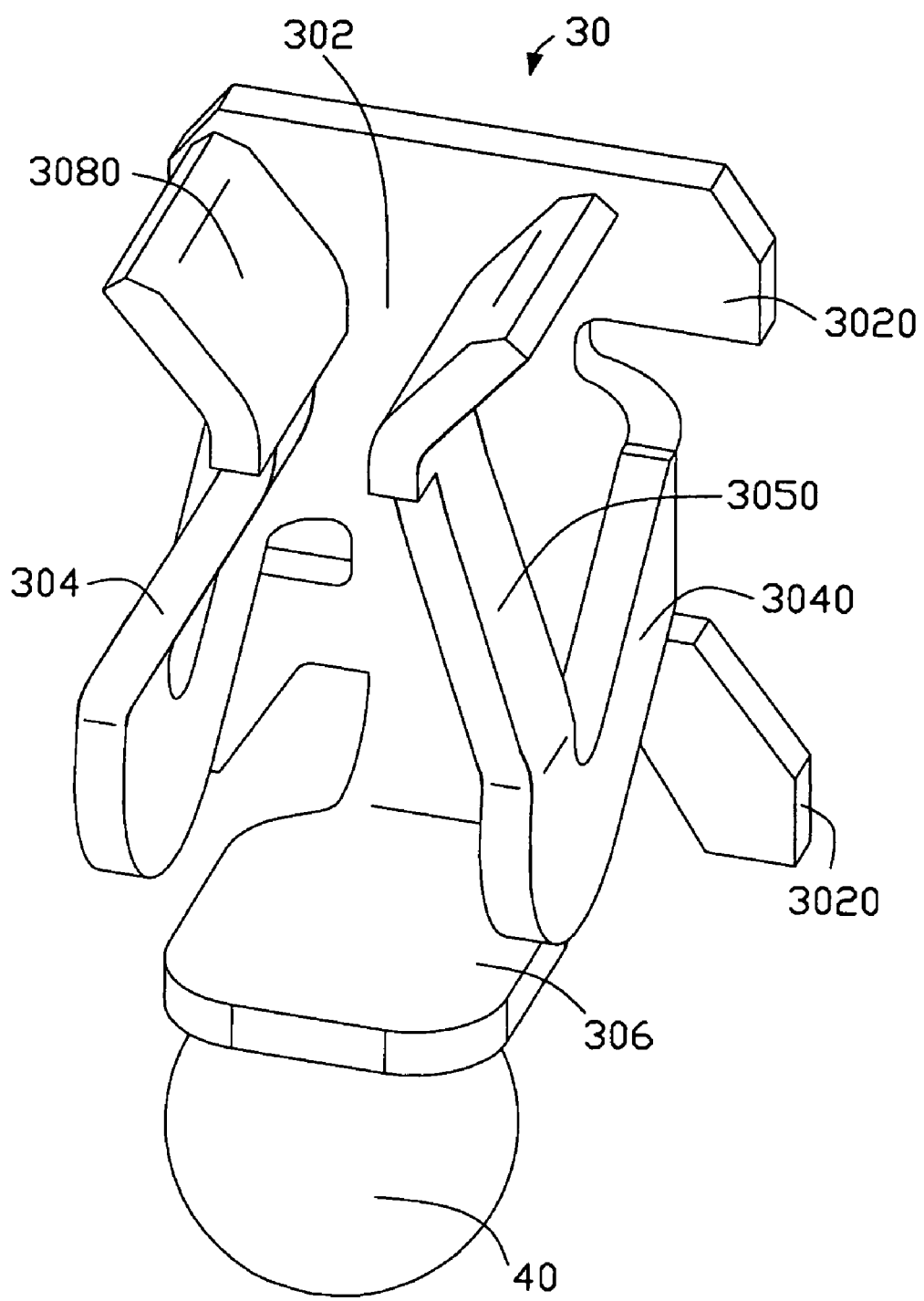
FIG. 2 is an enlarged view of the contact of FIG. 1.
Figure 3:
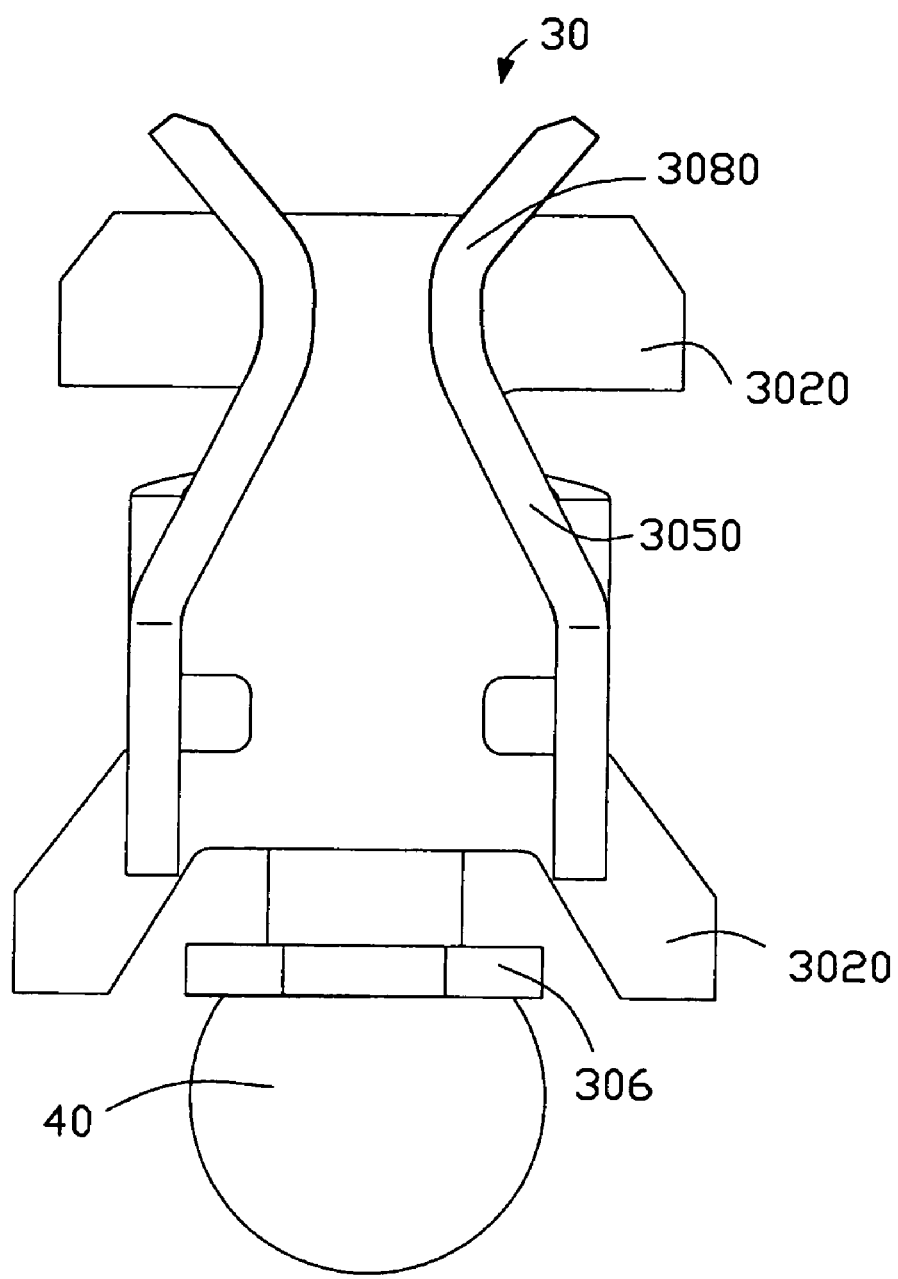
FIG. 3 is a front view of FIG. 2.
Figure 4:
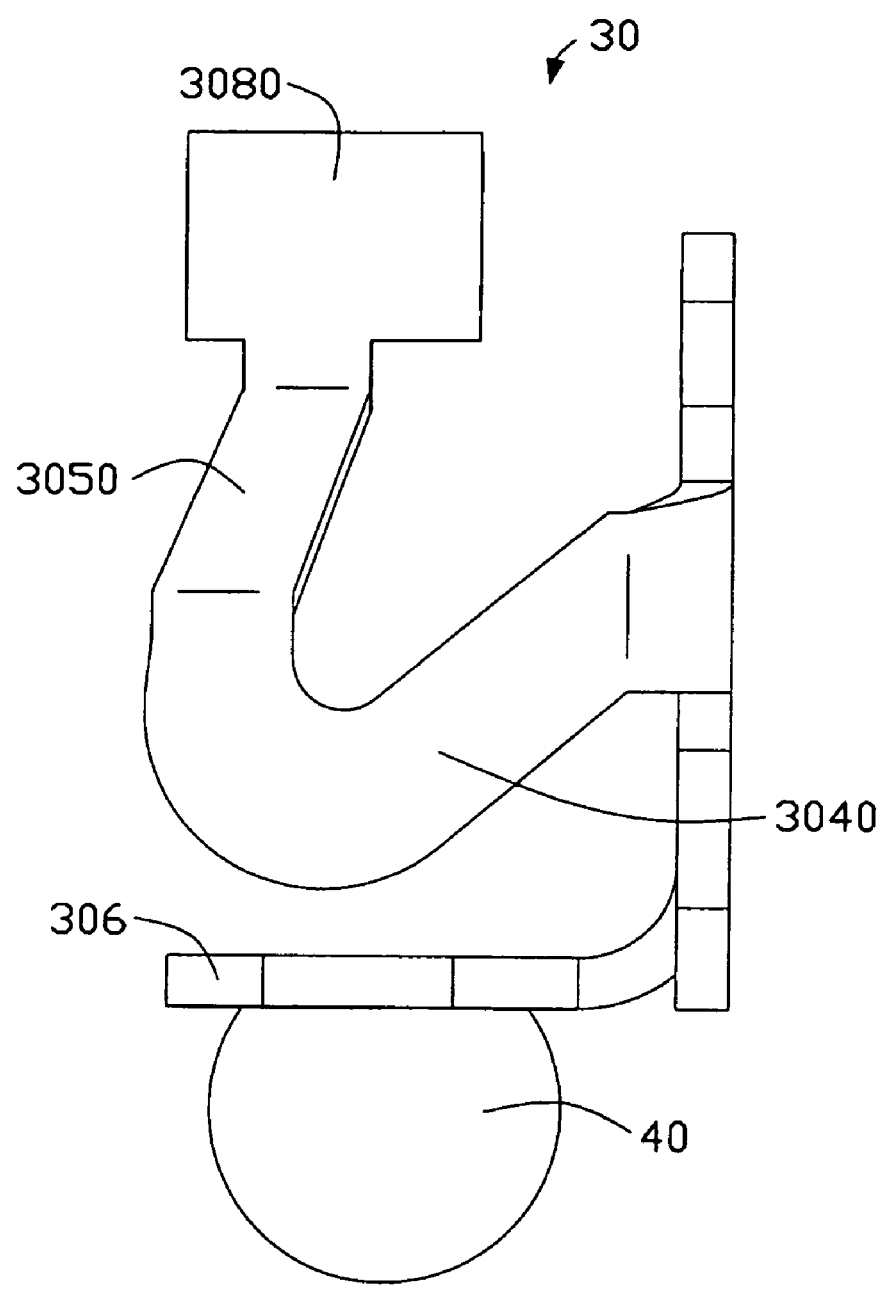
FIG. 4 is a side view of FIG. 2.

As indicated in FIGS. 2–4, the contact 30 comprises a planar body 302, a pair of arms 304 extending from two lateral sides of the planar body, a soldering pad 306 angled with respect to the planar 302, and a pair of contacting sections 3080 extending from distal ends of the arms 304.

The planar body 302 is tabular and extends along a vertical direction. Both upper and middle portions thereof respectively define a pair of fixing portions 3020 for holding the contact 30 in the passage 206 of the housing 20 stably. The soldering pad 306 of the contact 30 extends from the planar body 302 perpendicularly. A soldering ball 40 is attached to the soldering pad 306 for soldering the contact 30 onto the PCB.

Each arm comprises an extending arm 3040 extending downwardly from the planar body 302 and a spring arm 3050 extending upwardly from an end of the extending arm 3040 distance from the planar body 302. The spring arm 3050 is formed with a curved contacting section 3080 at a distal end thereof. The contact section 3080 having a smooth cambered surface extends upwardly and outwardly from the spring arm 3050. As indicated in FIGS. 6 and 7, the contacting section 3080 of the contact 30 is located above the planar body 302 in a vertical direction.

The curved contacting section increases the length of the arm 304 and improves the elasticity thereof. Pins 50 of the IC package can insert into or withdraw from the spring arms 3050 easily by virtue of the smooth curved surface of the contact 30.

Figure 6:
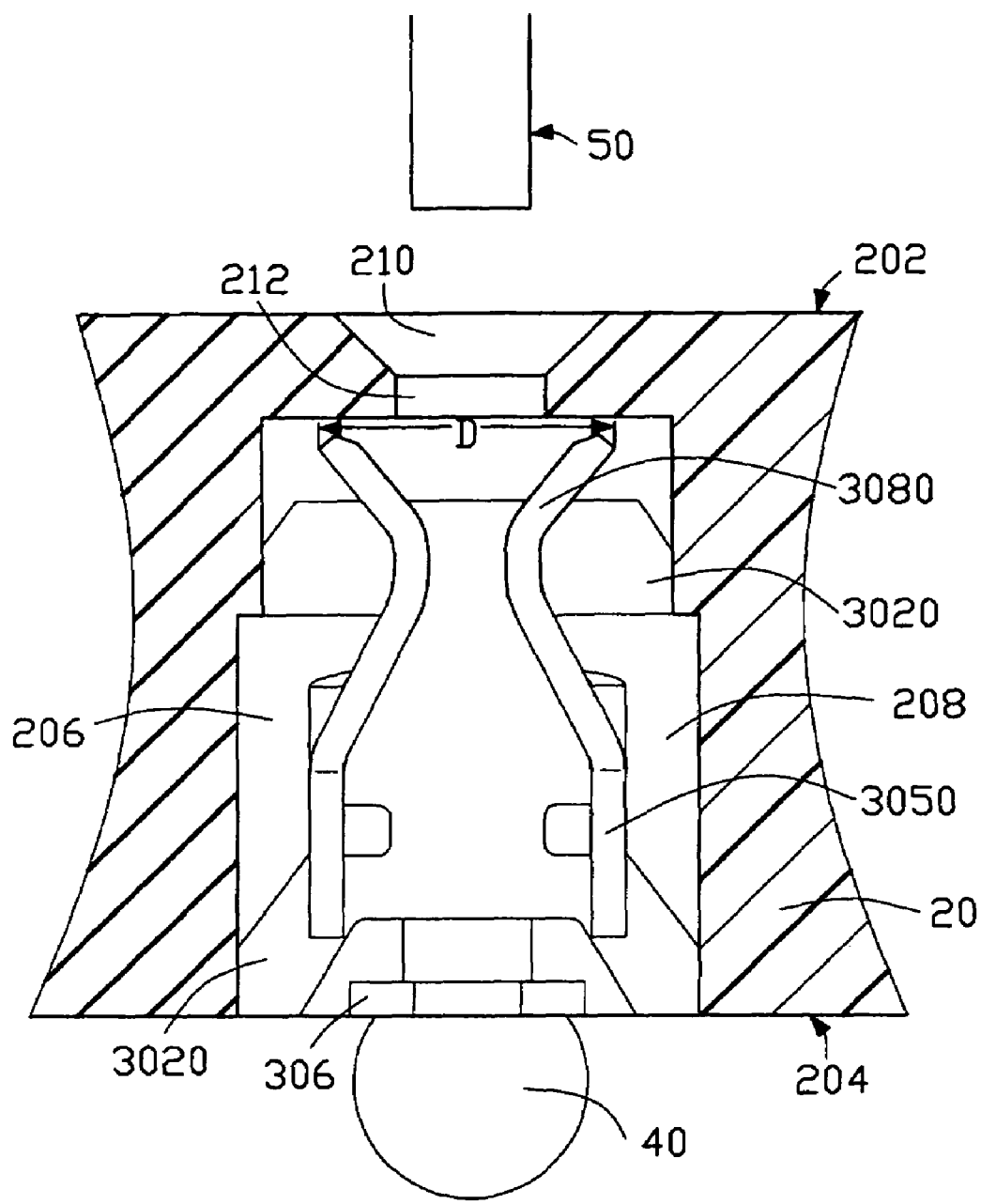
FIG. 6 is a cross sectional view of the socket, showing one contact inserted into a corresponding passage of the housing.

As indicated in FIGS. 6 and 7, during assembling, each contact 30 is inserted into the corresponding passage 206 from the mounting surface 204. The planar body 302 interferentially engages with an inner wall of the passage 206 by virtue of the fixed portion 3020, thereby fixing the contact 30 in the corresponding passage steadily.

As indicated in FIGS. 5 and 6, during use, each soldering ball 40 is soldered onto the PCB first, and the LIF socket is accordingly mounted on the PCB. Then the IC package is settled onto the LIF socket, and each pin of the IC package is aligned above the corresponding passage 206 of the housing 20. When the IC package is pressed downwardly, each pin 50 of the IC package gets through the corresponding connecting section 212 via the leading section 210 and inserts into the base section 208 of the passage 206. When each pin 50 contacts with contacting section 3080 of corresponding contact 30, the PCB and the IC package are electrically connected by the LIF socket 10.

More importantly, if the pins 50 of the IC package offset from a normal inserting position during assembling, leading section 210 and curved connecting sections 212 will guide them back to the normal position, and the pins 50 would insert into the corresponding passages 206 smoothly.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A LIF (low insertion force) socket for electrically connecting an IC (integrated circuit) package and a PCB (printed circuit board) comprising:

a housing having a supporting surface, a mounting surface opposite to the supporting surface, and plurality of passages extending through the mounting surface and the supporting surface, each passage having a leading section;

a plurality of contacts disposed in the passages, respectively, each contact having a planar body, a pair of arms extending from two lateral sides of the planar body, and a soldering pad angled with respect to the planar body, wherein the arm is formed with a curved contacting section having a smooth curved surface at a distal end for contacting a pin of the IC package;

wherein the passage comprises a base section and a connecting section between the base section and the leading section;

wherein the connecting section is a circular aperture having a diameter smaller than a distance between two distal ends of the contacting sections of an associated contact;

wherein the arm of the contact comprises an extending arm extending downwardly from the planar body, and a spring arm extending upwardly from a distal end of the extending arm far away from the planar body;

wherein the contacting section of the contact extends upwardly and outwardly from the spring arm;

wherein a distal end of the contacting section of the contact is above the planar body in a vertical direction;

wherein the mounting surface of the housing defines a plurality of standoffs; and wherein a soldering ball is attached to the soldering pad for soldering the contact onto the PCB.

2. The socket as claimed in claim 1, wherein the soldering pad of the contact extends from the planar body perpendicularly.

3. The socket as claimed in claim 1, wherein the planar body of the contact defines a pair of fixing portions.

4. A contact for a socket, comprising:

a vertical planar body;

a pair of arms extending from two lateral side of a middle portion of said planar body, respectively;

a soldering pad angled with respect to the planar body;

said pair of arms initially extending obliquely and downwardly in a parallel relation with each other, and successively upwardly along a distance with the same parallel relation, and then further including mutually converging sections moving toward each other with a narrowed gap therebetween, and sequentially mutually diverging sections moving away from each other to form enlarged outwardly upwardly curved guiding regions upper ends for receiving a pin therebetween;

wherein from a front elevational viewpoint, the converging sections and the diverging sections occupy around two thirds of a length of the corresponding spring arms in a vertical direction, and each of the guiding regions defines a rectangular shape with two spaced vertical edges parallel to the planar body.

* * * * *